US006967557B2

(12) United States Patent
Hagios et al.

(10) Patent No.: US 6,967,557 B2
(45) Date of Patent: Nov. 22, 2005

(54) WAFER TEST SPACE TRANSFORMER

(75) Inventors: John F. Hagios, Colchester, VT (US); Mohammed S. Shaikh, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,899

(22) Filed: Aug. 26, 2003

(65) Prior Publication Data

US 2005/0046537 A1 Mar. 3, 2005

(51) Int. Cl.[7] .............................................. H01F 5/00
(52) U.S. Cl. ..................................................... 336/200
(58) Field of Search .......................... 336/83, 200, 232; 439/66, 101; 324/754–762

(56) References Cited

U.S. PATENT DOCUMENTS 3,911,361 A * 10/1975 Bove et al. .................. 324/761
4,734,046 A * 3/1988 McAllister et al. .......... 439/101
6,410,858 B1 * 6/2002 Sasaki et al. ................ 174/255

* cited by examiner

*Primary Examiner*—Tuyen Nguyen
(74) *Attorney, Agent, or Firm*—Schmeiser, Olsen & Watts; Robert A. Walsh

(57) ABSTRACT

A space transformer including a body; a ground conductor within the body; a power conductor within the body, the power conductor adapted to be at a higher voltage level than a voltage level of the ground conductor; and one or more decoupling capacitors physically located within the body and electrically connected between the ground conductor and the power conductor.

9 Claims, 15 Drawing Sheets

WAFER TEST SPACE TRANSFORMER

BACKGROUND OF INVENTION

Field of the Invention

The present invention relates to the field of integrated circuit chip testing; more specifically, it relates to a space transformer for use in a system for testing integrated circuit chips on a wafer.

Background of the Invention

Typical wafer level test of integrated circuit chips consists of a set of probes for contacting controlled collapse chip connections (C4s also known as solder bumps) and contact pads of the integrated circuit chip mounted to a space transformer which in turn is mounted to a probe card, the probe card is in turn connected to a tester. The tester supplies power, ground and signals to the integrated circuit chip also known as a device under test (DUT). Two basic problems must be overcome when testing semiconductor integrated circuit chips in this manner. First, the amount of power to be supplied must be sufficient to respond to power surges while transistors and other devices in the integrated circuit chip are switching. Second, as power surges occur, coupling noise on signal lines is generated which must be minimized.

SUMMARY OF INVENTION

A first aspect of the present invention is a space transformer comprising: a body; a ground conductor within the body; a power conductor within the body, the power conductor adapted to be at a higher voltage level than a voltage level of the ground conductor; and one or more decoupling capacitors physically located within the body and electrically connected between the ground conductor and the power conductor. A second aspect of the present invention is a wafer test apparatus comprising: a probe card; a space transformer mounted to a top surface of the probe card, the space transformer comprising: a body; a ground conductor within the body; a power conductor within the body, the power conductor adapted to be at a higher voltage level than a voltage level of the ground conductor; and one or more decoupling capacitors physically located within the body and electrically connected between the ground conductor and the power conductor; and a probe mounted to the space transformer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

The goal of a "good" power delivery system, and this critically includes the space transformer portion of that system, is to provide the device under test (DUT), an integrated circuit chip, with minimal power supply voltage variations throughout the dynamic operating range of the DUT and to minimize inductance and resistance between the power supply and the DUT while at the same time providing sufficient local power storage to supply instantaneous demands of high speed transistor switching. The power delivery system results in an inductance-resistance-capacitance (LRC) network with complex transfer characteristics that vary over a wide signal frequency spectrum. A "good" power delivery system will minimize the inductance and resistance while providing capacitive decoupling.

At low signal frequencies (DC to KHz) the large decoupling capacitors (thousands of $\mu F$) are utilized. At mid signal frequencies (KHz to hundreds of MHz) relatively small (tens of $\mu F$) decoupling capacitors are used. At high signal frequencies (GHz and up) very small (sub $\mu F$) decoupling capacitors that are also very low inductance capacitors (1 nano Henry to 10 pico Henries) are used. While the total inductance between the decoupling capacitor and the DUT must be minimized (and this includes capacitor parasitic, interconnection and probe inductance) for mid signal frequency devices it is especially import to do so for high signal frequencies. The present invention solves these problems by providing a robust ground and power network and by placing the decoupling capacitors very close to the test probes and by minimizing signal wire cross-talk.

A "space transformer" is so called because it transforms the spacing of chip contacts with respect to an integrated circuit chip to a larger spacing that will accommodate printed circuit board (PCB) wiring and/or conventional wires. A chip contact is defined as a C4, solder bump, contact pad, non-solder bump or other electrical chip connection known in the art.

The space transformer of the first embodiment of present invention includes six elements that will be illustrated and described in turn after which the assembled space transformer will be described.

Figure 1A:
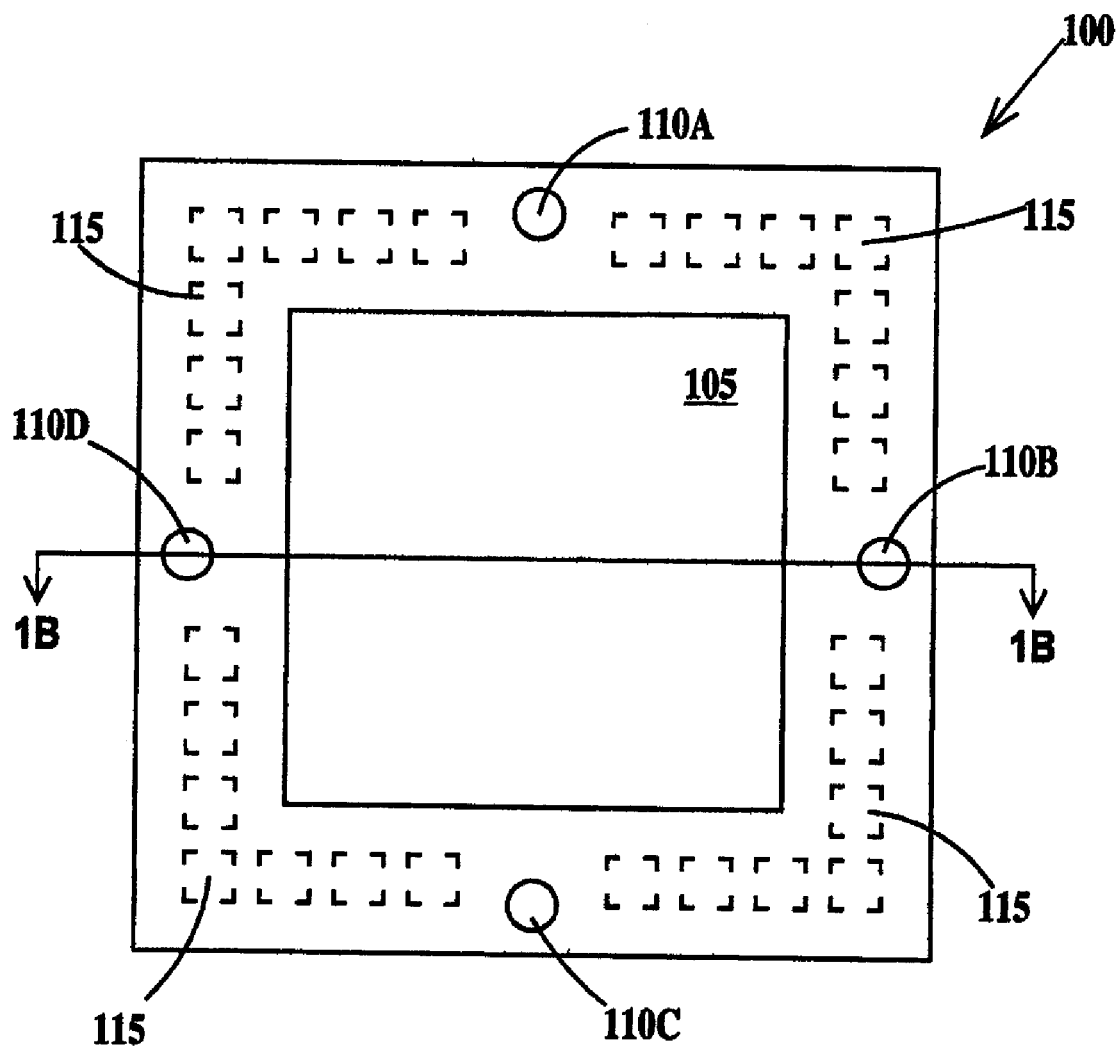
FIG. 1A is a top view.
Figure 1B:
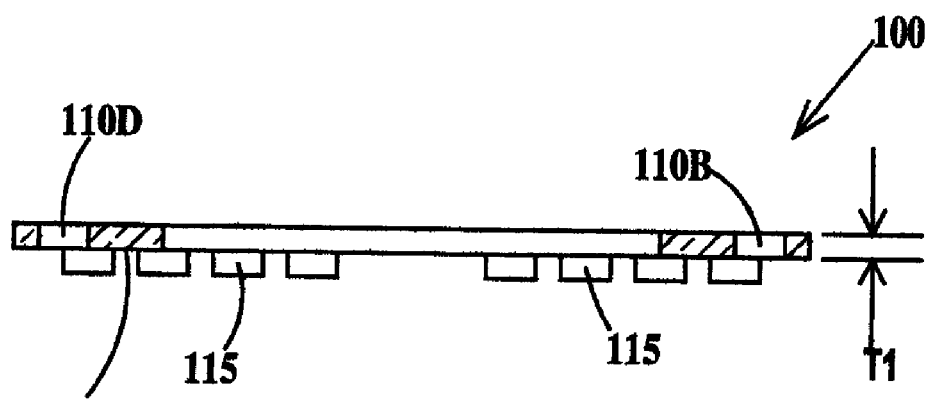
FIG. 1B is a cross-sectional view through line 1B—1B of FIG. 1A of a first element of a space transformer according to a first embodiment of the present invention.

FIG. 1A is a top view and FIG. 1B is a cross-sectional view through line 1B—1B of FIG. 1A of a first element of a space transformer according to a first embodiment of the present invention. In FIGS. 1A and 1B, a capacitor board 100 (which may be a printed circuit board) includes a opening 105 and plated through holes 110A, 110B, 110C and 110D and a multiplicity of decoupling capacitors 115 physical mounted to an underside 120 of capacitor board 100. Each decoupling capacitor 115 is electrically connected (by wires, not shown, within capacitor board 100) across at least two of plated through holes 110A, 110B, 110C and 110D. For purposes of illustration, in one example, plated through holes 110A and 110C are reserved for ground and plated through holes 110B and 110D are reserved for power. Each decoupling capacitor 115 is electrically connected between a plated through hole reserved for ground and a plated through hole reserved for power. While four plated through holes 110A through 110D are illustrated in FIG. 1A, any number of plated through holes may be employed for the purposes of reducing electrical path length and/or for connection to multiple ground and/or power sources.

In one example, capacitor board 100 has a thickness T1 of about 0.012 inches. While only 28 decoupling capacitors are illustrated in FIGS. 1A and 1B, the number of decoupling capacitors is limited only by physical space constraints and can rage up to a hundred or more based on a design that provides the best decoupling. In a first example, decoupling capacitors 115 are low inductance decoupling capacitor arrays (LICA) developed by IBM, Armonk, NY and AVX, Myrtle Beach, Calif. In a second example, decoupling capacitors 115 are multilayer ceramic capacitors such as 1210 series capacitors. In a third example, decoupling capacitors 115 are IBM proprietary C4 capacitors. In one example, decoupling capacitors 115 can have inductance values ranging from about 1 nano-Henry to about 175 pico-Henries and in a second example for high frequency application, decoupling capacitors 115 can have inductance values of 60 pico-Henries or less.

Figure 2A:
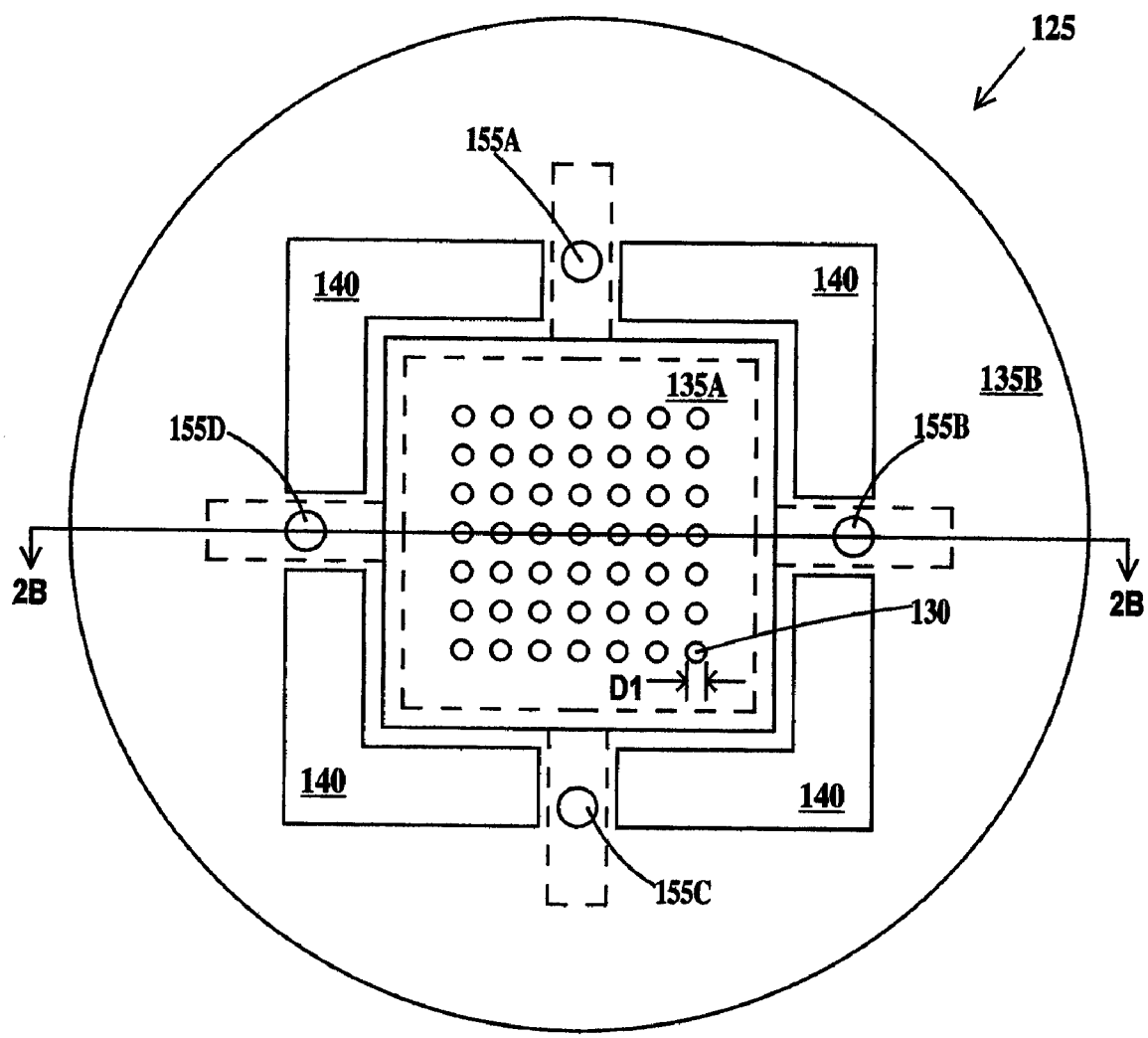
FIG. 2A is a top view.
Figure 2B:
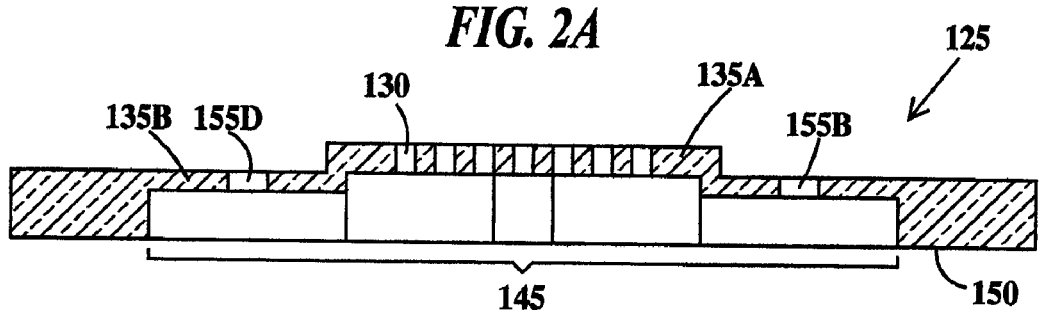
FIG. 2B is a cross-sectional view through line 2B—2B of FIG. 2A of a second element of the space transformer according to the first embodiment of the present invention.

FIG. 2A is a top view and FIG. 2B is a cross-sectional view through line 2B—2B of FIG. 2A of a second element of the space transformer according to the first embodiment of the present invention. In FIGS. 2A and 2B, a transformer die 125 includes a multiplicity of through-holes 130 arranged in the same pattern and to the same pitch (chip contact to chip contact distance) as the chip contacts on an integrated circuit chip to be tested in a raised central region 135A of the transformer die. While an exemplary 7 by 7 array of through-holes 130 is illustrated in FIG. 2A, it should be understood that there may be thousands of chip contacts arranged in any number of patterns on an integrated circuit chip. Transformer die 125 comprises the body of the space transformer. In one example, through-holes 130 have a diameter D1 of about 0.0055 inches when un-insulated wires and pins are used and about 0.0065 when insulated wires and pins are used. Transformer die 125 is fabricated from a dielectric material. In one example transformer die 125 is fabricated from Vespel™ (a polyimide resin), manufactured by Dupont, Wilmington, Del.

Transformer die 125 includes "L"shaped slots 140 in an outer region 135B of the transformer die. Transformer die 125 also includes a cavity 145 open to a bottom surface 150 of the transformer die and through holes 155A, 155B, 155C and 155D open to cavity 145. Through holes 155A, 155B, 155C and 155D align to plated through holes 110A, 110B, 110C and 110D of FIG. 1A respectively during assembly. Slots 140 may or may not be open to cavity 145 and if not open to cavity 145 are deep enough to receive decoupling capacitors 115 (see FIG. 1B).

Figure 3A:
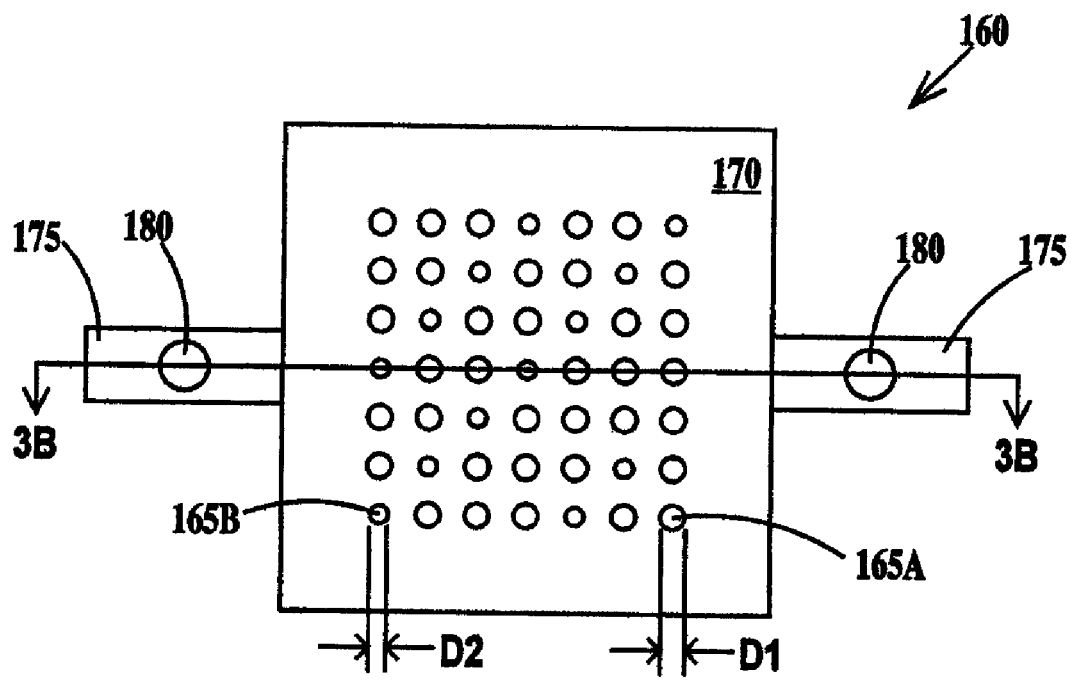
FIG. 3A is a top view.
Figure 3B:
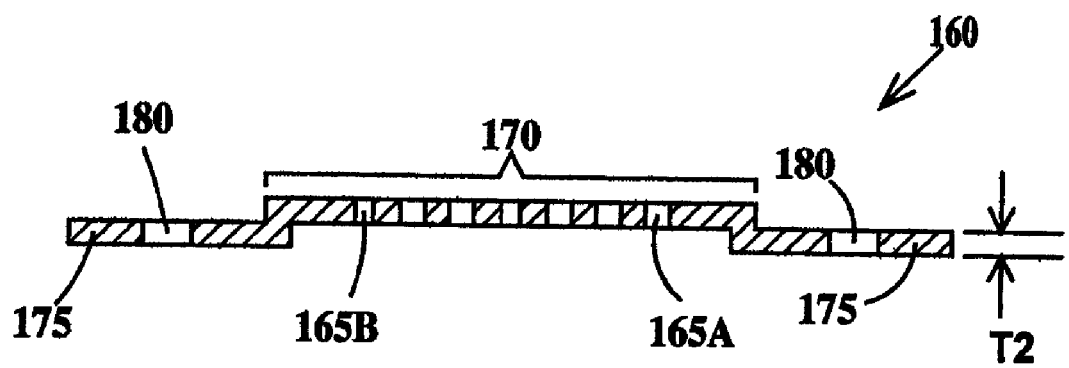
FIG. 3B is a cross-sectional view through line 3B—3B of FIG. 3A of a third element of the space transformer according to the first embodiment of the present invention.

FIG. 3A is a top view and FIG. 3B is a cross-sectional view through line 3B—3B of FIG. 3A of a third element of the space transformer according to the first embodiment of the present invention. In FIGS. 3A and 3B a ground conductor 160 includes a multiplicity of through-holes 165A and 165B arranged in the same pattern and to the same pitch as through-holes 130 of FIG. 2A. Ground conductor 160 includes an inner region 170 (which includes through-holes 165A and 165B) and tabs 175. Tabs 175 include through holes 180 sized to make physical and electrical contact to assembly screws (or other fasteners) as illustrated in FIG. 6B and described infra. In one example, through-holes 165A have a diameter D1 of about 0.0055 to 0.0065 inches and allow insulated/un-insulated pins/wires to pass through without electrical contact and through holes 165B have a diameter D2 of about 0.0055 to engage ground pins (see FIG. 6B) having an upper portion with a diameter of about 0.005 inches and a lower portion with a diameter of about 0.006 inches, which lower portion physically and electrically engages through holes 165B. In one example, ground conductor 160 has a thickness T2 of about 0.030 inches. Ground conductor 160 is fabricated from a conductive material. In one example, ground conductor 160 is fabricated from a metal such as copper or aluminum. Ground conductor 160 is (conventionally) electrically connected to a ground terminal of a power supply. Through holes 180 align with through holes 110B and 110D of FIG. 1A during assembly.

Figure 4A:
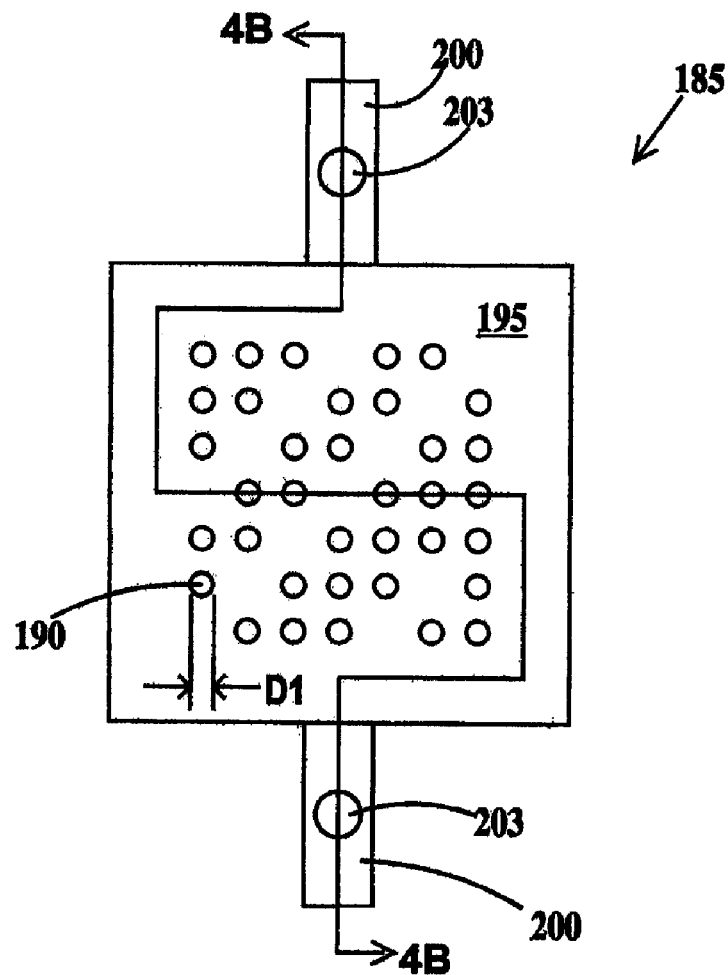
FIG. 4A is a top view and FIG. 4B is a cross-sectional view through line 4B—4B of FIG. 4A of a fourth element of the space transformer according to the first embodiment of the present invention.
Figure 4B:
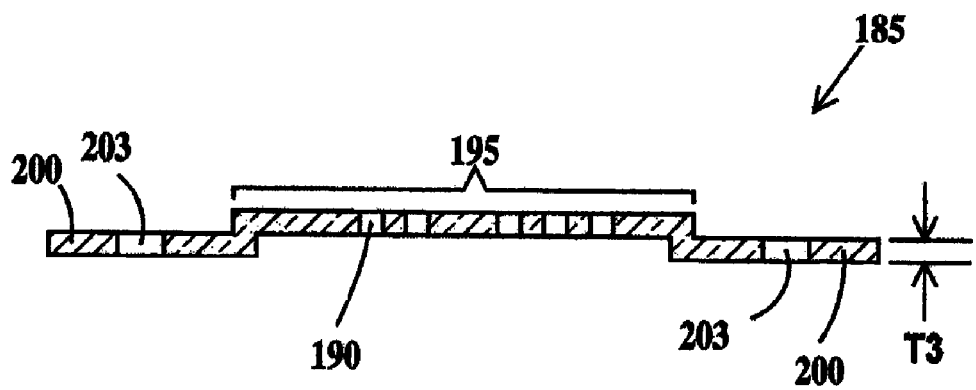

FIG. 4A is a top view and FIG. 4B is a cross-sectional view through line 4B—4B of FIG. 4A of a fourth element of the space transformer according to the first embodiment of the present invention. In FIGS. 4A and 4B, an insulator 185 includes a multiplicity of through-holes 190 arranged in the same pattern and to the same pitch as through-holes 130 of FIG. 1A except there is no through-hole 190 in any position corresponding to a chip contact of the integrated circuit chip that carries ground. Insulator 185 includes an inner region 195 (which includes through-holes 190) and tabs 200. Tabs 200 include through holes 203 sized to allow clearance for assembly screws (or other fasteners) as illustrated in FIG. 6B and described infra. In one example, through-holes 190 have a diameter D1 of about 0.0055 to 0.0065 inches and insulator 185 has a thickness T3 of about 0.001 to 0.015 inches. Insulator 185 is fabricated from a dielectric material. In one example, insulator 185 is fabricated from Vespel™ or Kapton™ (a polyimide) manufactured by Dupont, Wilmington, Del. Through holes 203 align with through holes 110A and 110CD of FIG. 1A during assembly.

Figure 5A:
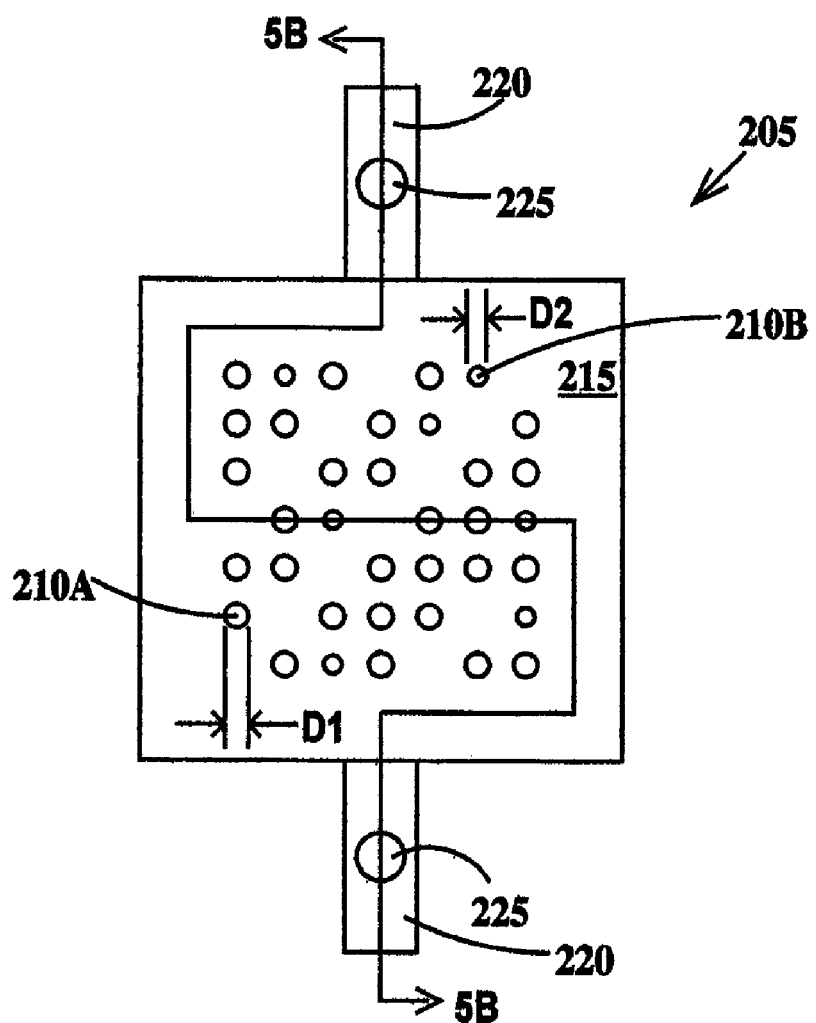
FIG. 5A is a top view and FIG. 5B is a cross-sectional view through line 5B—5B of FIG. 5A of a fifth element of the space transformer according to the first embodiment of the present invention.
Figure 5B:
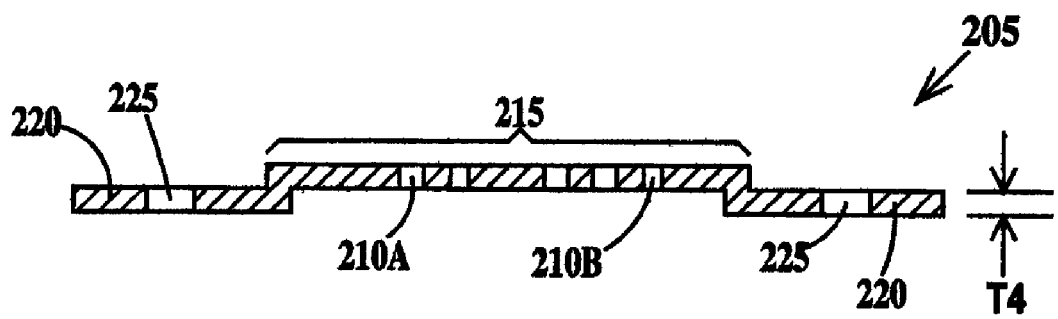

FIG. 5A is a top view and FIG. 5B is a cross-sectional view through line 5B—5B of FIG. 5A of a fifth element of die space transformer according to the present invention. In FIGS, 5A and 5B a power conductor 205 includes a multiplicity of through-holes 210A and 210B arranged in the same pattern and to the same pitch as through-holes 130 of FIG. 2A except there is no through-hole 210A or 210B in any position corresponding to a chip contact of the integrated circuit chip that carries ground. Power conductor 205 includes an inner region 215 (which includes through-holes 210A and 210B) and tabs 220. Tabs 220 include through holes 225 sized to make physical and electrical contact to assembly screws (or other fasteners) as illustrated in FIG. 6B and described infra. In one example, through-holes 210A have a diameter D1 of about 0.0055 to 0.0065 inches and allow insulated/un-insulated pins/wires to pass through without electrical contact and through holes 210B have a diameter D2 of about 0.0055 to engage ground pins (see FIG. 6B) having an upper portion with a diameter of about 0.005 inches and a lower portion with a diameter of about 0.006 inches, which lower portion physically and electrically engages through holes 210B. In one example, power conductor 205 has a thickness T4 of about 0.030 inches. Power conductor 205 is fabricated from a conductive material. In one example, power conductor 205 is fabricated from a metal such as copper or aluminum. Power conductor 205 is (conventionally) electrically connected to a power terminal eta power supply. Through holes 225 align with through holes 110B and 110D of FIG. 1A during assembly.

Figure 6A:
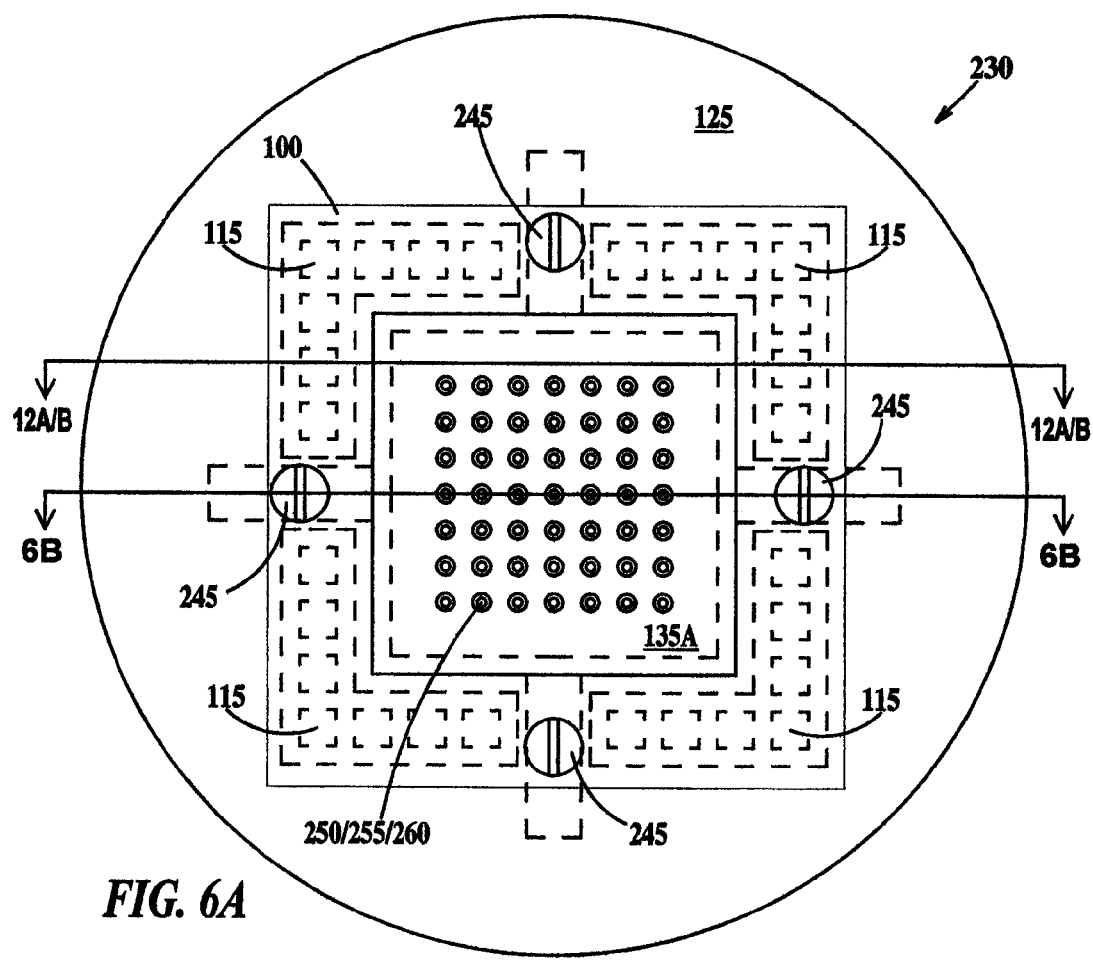
FIG. 6A is a top view of an assembled space transformer and FIG. 6B is a cross-sectional view through line 6B—6B of FIG. 6A of the assembled space transformer mounted on a probe card.
Figure 6B:
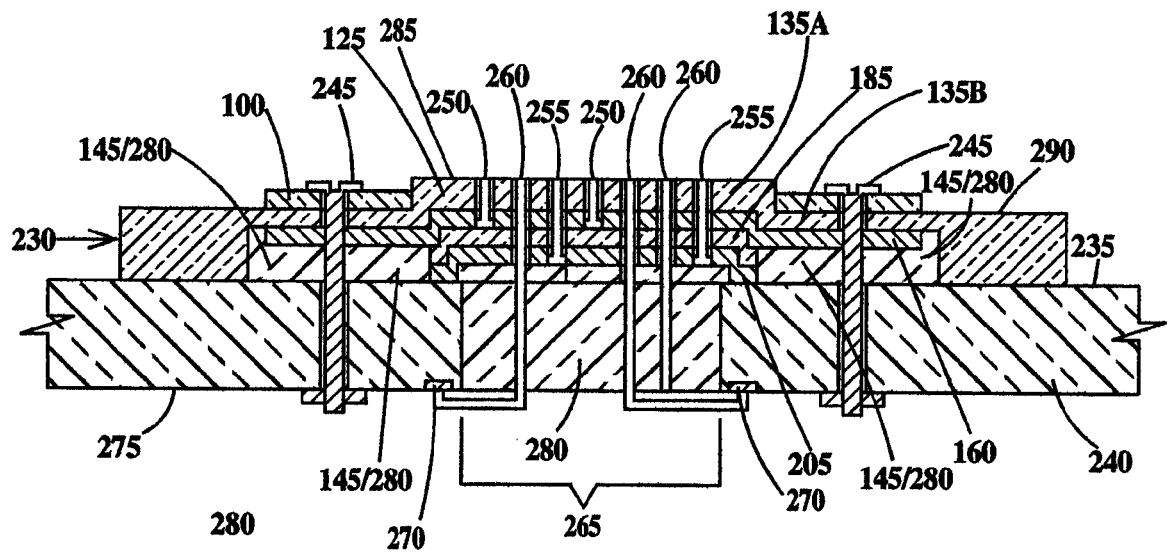

FIG. 6A is a top view of an assembled space transformer 230 and FIG. 6B is a cross-sectional view through line 6B—6B of FIG. 6A of the assembled space transformer mounted on a probe card 240. In FIGS. 6A and 6B assembled space transformer 230, includes capacitor board 100 (including decoupling capacitors 115), transformer die 125, ground conductor 160, insulator 185, power conductor 205 mounted to a top surface 235 of a probe card 240 by screws (or other fasteners) 245. Probe card 240 is fabricated from a dielectric material containing multiple wiring levels and through holes and plated through holes (i.e. a printed circuit board). Electrically conductive ground pins 250 are press fitted into ground conductor 160 and electrically conductive power pins 255 are press fitted into power conductor 205. Signal wires 260 pass through transformer die 125, ground conductor 160, insulator 185, power conductor 205 (without electrically contacting the ground and power conductors), cavity 145 in the transformer die, opening 265 in probe card 240 and are soldered to contacts 270 on a bottom surface 275 of probe card 240. Cavity 145 and opening 265 are filled with dielectric material 280. The space between ground pins 250, power pins 255 and signal wires 260 and the various through holes in transformer die 125, ground conductor 160, insulator 185 and power conductor 205 are also filled with dielectric material 280 and the ground pins, power pins and signal wires are polished co-planer with a top surface 285 of raised central region 135A of the transformer die. In one example, dielectric material 280 is an epoxy resin.

Space transformer 230 is assembled as follows: (1) ground conductor 160 is placed in cavity 145 of transformer die 125; (2) ground pins 250 are press fitted into selected through holes 165B (see FIG. 3A) in ground conductor 160; (3) insulator 185 is placed in cavity 145; (4) power conductor 205 is placed in cavity 145; (5) power pins 255 are press fitted into selected through holes 210B (see FIG. 5A); (6) capacitor board 100 is placed on transformer die 125; (7) transformer die 230 is fastened to probe card 240 by screws (or other fasteners) 245; (8) signal wires 260 are inserted, passing through opening 265 in probe card 240, power conductor 205, insulator 185, ground conductor 160 and transformer die 125; (9) signal wires 260 are soldered to contacts 270 on probe card 240; (10) cavity 145 is filled with dielectric material 280 and (11) the tips of ground pins 250, power pins 255 and signal wires 260 protruding from transformer die 125 are polished co-planer with top surface 285 of the transformer die.

It should be noted that decoupling capacitors 115 are physically located below a top surface 290 of outer region 135B of transformer die 125 or in cavity 145 (see FIGS. 12A and 12B) thus reducing to a minimum the capacitor interconnect inductance and resistance parasitics. The length of the electrical path between decoupling capacitors 115 and tips of ground pins 250 and power pins 255 at the surface of space transformer 230 is between about 5 to 25 millimeters. The length of the electrical path between the tips of ground pins 250 and power pins 255 at the top surface of space transformer and ground conductor 160 and power conductor 205 respectively is about 1 to 3 mm. Also, because of the thickness of ground conductor 160 and of power conductor 205, resistive parasitics are reduced and more current can be carried with reduced voltage drop. Because of the location of decoupling capacitors 115 within space transformer 230, more decoupling capacitance is available than with conventional space transformers.

Ground pins 250, power pins 255 and signal wires 260 are illustrated as un-insulated. Insulated ground pins and/or insulated power pins and/or insulated signal wires or combinations of insulated and un-insulated wires and pins may be used.

Figure 7A:
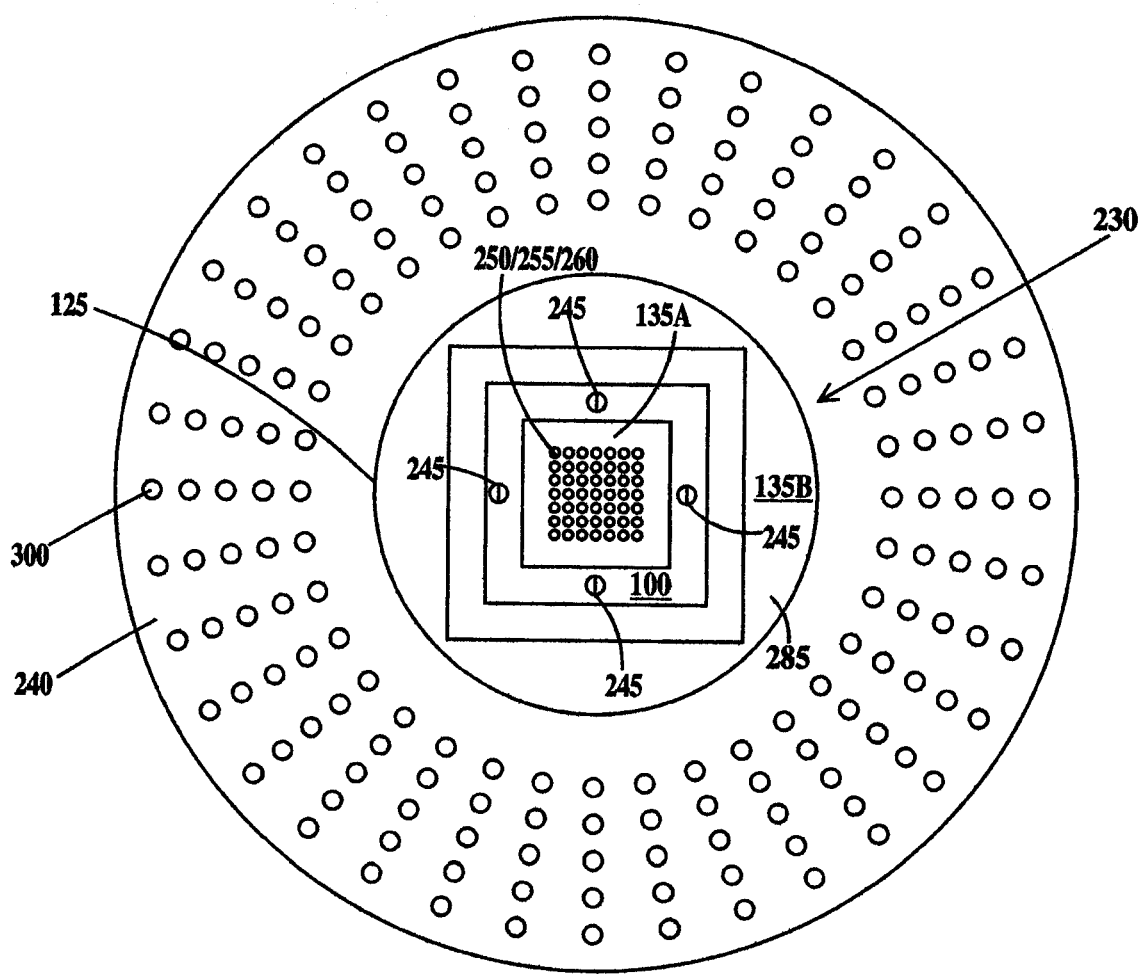
FIG. 7A is top view and FIG. 7B is a side view of the assembled space transformer mounted on a probe card according to the first embodiment of the present invention.
Figure 7B:
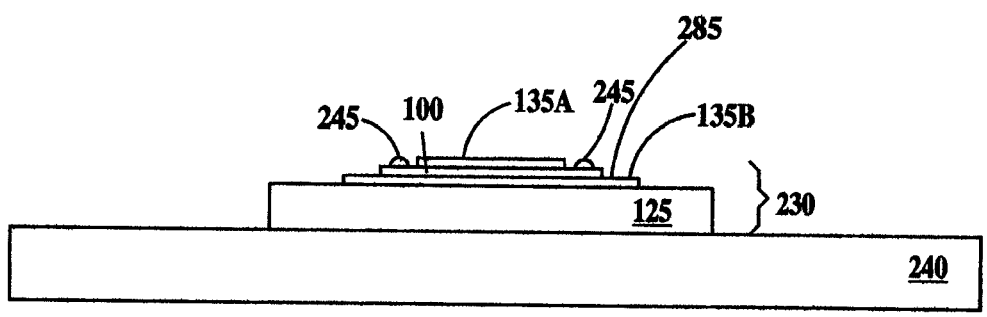

FIG. 7A is top view and FIG. 7B is a side view of assembled space transformer 230 mounted on probe card 240 according to the first embodiment of the present invention. In FIGS. 7A and 7B, capacitor board 100 is mounted on top of outer region 135B of transformer die 125, surrounds raised central region 135A of the transformer die and is either flush with top surface 285 of the central region or lower. Transformer die 125 is mounted to probe card 240 by screws (or other fasteners) 245. A series of plated through holes 300 formed in probe card 240 provide means to make electrical connection between a tester and individual signal wires 260 through wires (not shown) formed in the probe card. Similarly, certain plated through holes 300 are electrically connected by wires (not shown) formed in the probe card to screws 245 in order to provide ground and power connections.

Figure 8:
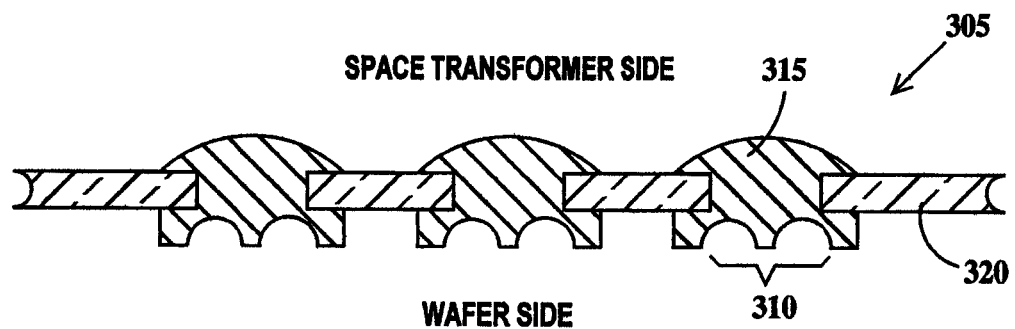
FIG. 8 is a partial cross-sectional view of a thin film interface (TFI) probe.

FIG. 8 is a partial cross-sectional view of a TFI probe. Probe 305 is a thin film interface (TFI) probe. Probe tips 310 interlock in holes 315 in dielectric membrane 320. Other types of probes, for example cantilevered probes (probes where the probes tips extend over the DUT from a support), spring-loaded probes, i.e. COBRA probes, where an array of spring-loaded contacts is placed over the DUT) and other types of probes equally well known in the art may also be used, but TFI probes have less parasitics and reduce the power, ground an signal electrical path lengths.

Figure 9:
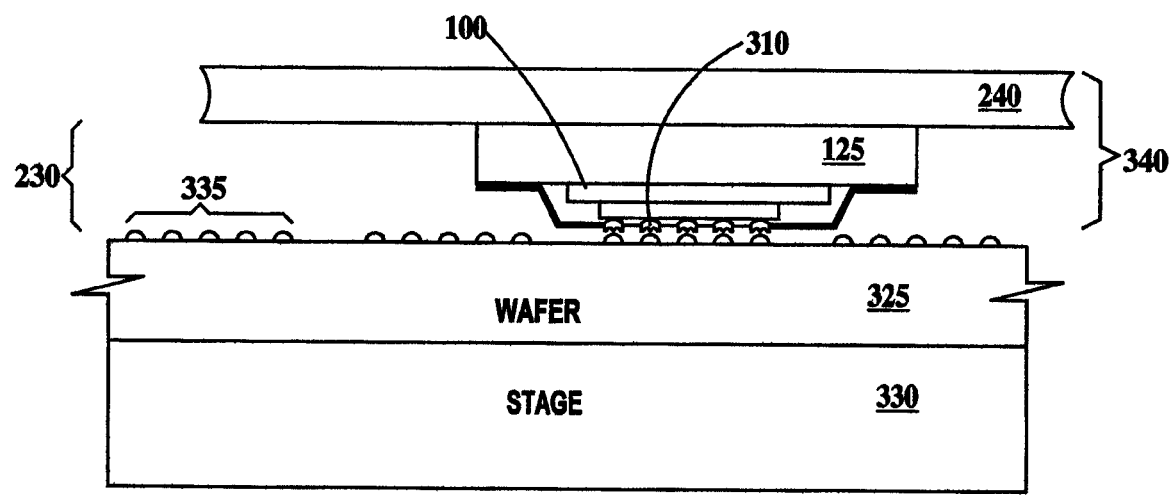
FIG. 9 is a partial side view of an integrated circuit chip wafer under test.

FIG. 9 is a partial side view of an integrated circuit chip wafer under test. In FIG. 9, an integrated circuit chip wafer 325 is held on a stepping stage 330 free to move in two orthogonal co-planer directions as well as rotate about and axis perpendicular to the co-planer directions. Wafer 325 includes an array of chip contact interconnect 335 corresponding to multiple chips on the wafer. Probe tips 310 contact chip contact interconnects 335 and ground pins 250 (see FIG. 6B), power pins 255 (see FIG. 6B), and signal wires 260 (see FIG. 6B)of space transformer 230 when probe assembly 340 and wafer 325 are brought together. Stage 330 allows stepping from one chip to another in order to test all chips on the wafer.

Figure 10:
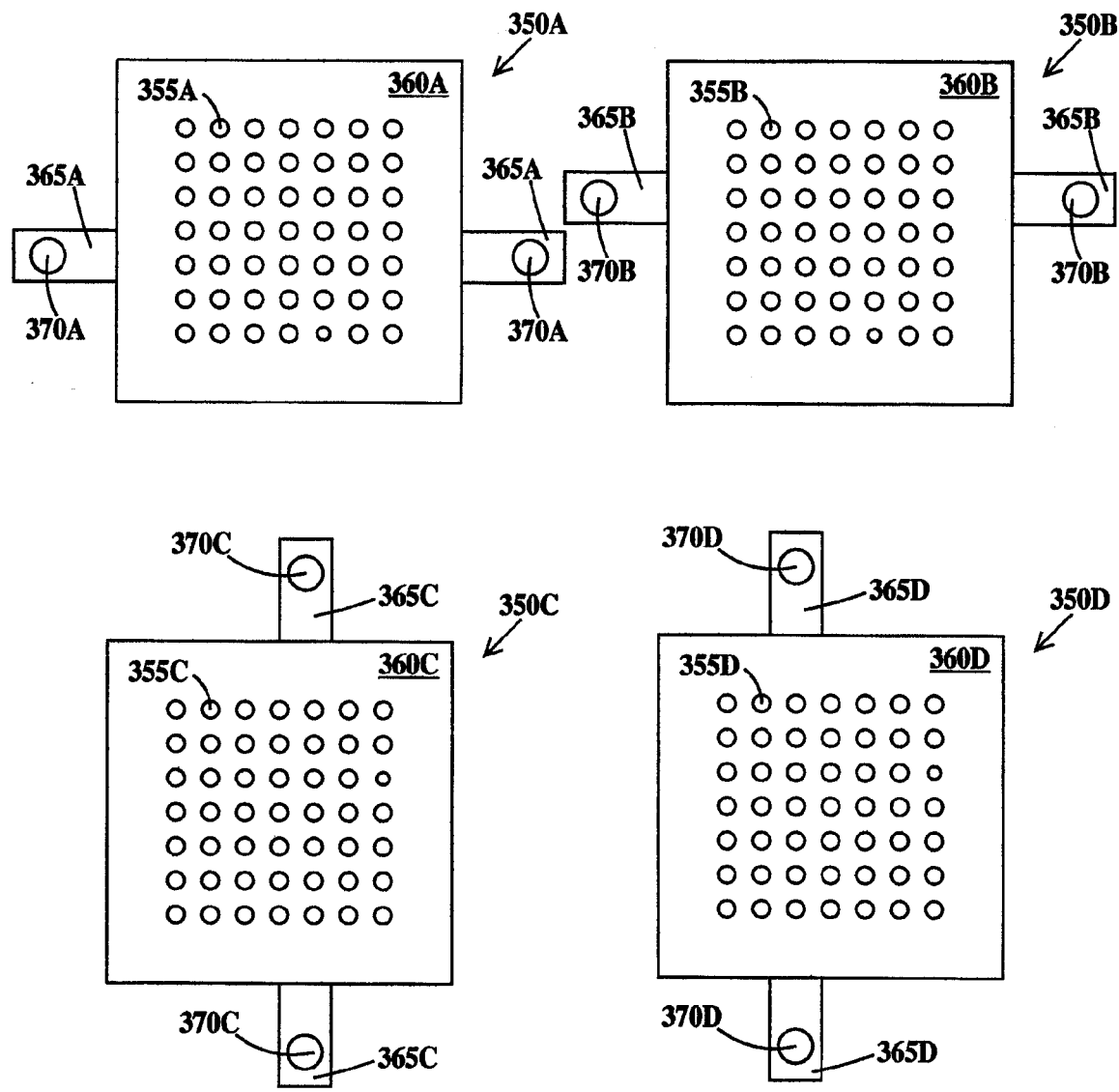
FIG. 10 illustrates top views of multiple power and ground planes for use in a multiple power/ground plane option of the first embodiment of the present invention.

FIG. 10 illustrates top views of multiple power and ground planes for use in a multiple power/ground plane option of the first embodiment of the present invention. In FIG. 10, conductors 350A, 350B, 350C and 350D are similar to ground conductor 160 of FIG. 3A and power conductor 205 of FIG. 5A. Conductor 350A includes through holes 355A formed in inner region 360A and tabs 365A having through holes 370A. Conductor 350B includes through holes 355B formed in inner region 360B and tabs 365B having through holes 370B. Conductor 350C includes through holes 355C formed in inner region 360C and tabs 365C having through holes 370C. Conductor 350D includes through holes 355D formed in inner region 360D and tabs 365D having through holes 370D. Tabs 365A, 365B, 365C and 365D are positioned relative to through holes 355A, 355B, 355C and 355D respectively, such that when through holes 355A, 355B, 355C and 355D of conductor 350A, 350B, 350C and 350D respectively are aligned during assembly (i.e. stacked), through holes 370A, 370B, 370C and 370D in tabs 365A, 365B, 365C and 365D are not aligned, but offset, allowing screws (or fasteners) to make electrical contact with specific conductors. While FIG. 10 illustrates four exemplary conductors (allowing from three power conductors and one ground conductor to three ground conductors and one power conductor) any number of conductors may be utilized.

Figure 11:
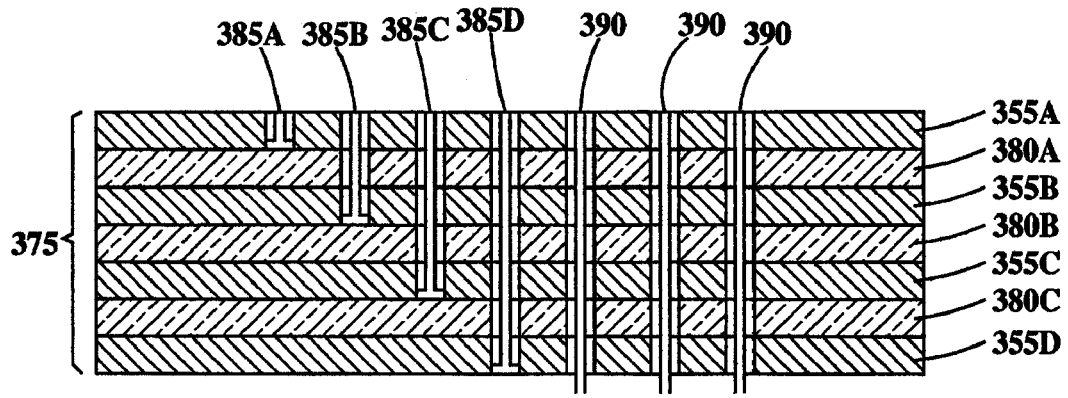
FIG. 11 is a cross-section view illustrating pin and wire connections in a multiple power/ground plane option of the first embodiment of the present invention.

FIG. 11 is a cross-section view illustrating pin and wire connections in a multiple power/ground plane option of the first embodiment of the present invention. Continuing the example of FIG. 10, in FIG. 11, conductor stack 375 includes from top to bottom, conductor 355A, an insulator 380A, conductor 355B, an insulator 380B, conductor 355C, and insulator 380C and conductor 355D. A pin 385A is mechanically and electrically connected to conductor 355A, a pin 385B is mechanically and electrically connected to conductor 355B and passes through conductor 355A and insulator 380A without making electrical contact with conductor 355A, a pin 385C is mechanically and electrically connected to conductor 355C and passes through insulators 380A and 380B and conductors 355A and 355B without making electrical contact with conductors 355A and 355B and a pin 385D is mechanically and electrically connected to conductor 355D and passes through insulators 380A, 380B and 380C and conductors 355A, 355B and 355C without making electrical contact with conductors 355A, 355B and 355C. Signal wires 390 pass through conductors 355A, 355B, 355C and 355D (as well as insulators 380A, 380B and 380C) without making electrical contact with conductors 355A, 355B, 355C and 355D.

Figure 12A:
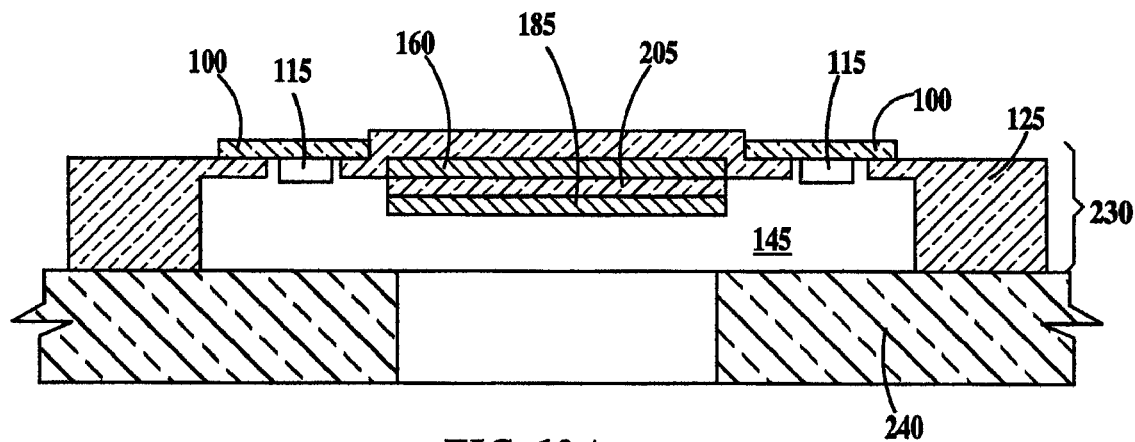
FIGS. 12A and 12B are cross-sectional views through line 12A/B—12A/B of FIG. 6A of the assembled space transformer and probe card of the according to two alternatives of first embodiment of the present invention.
Figure 12B:
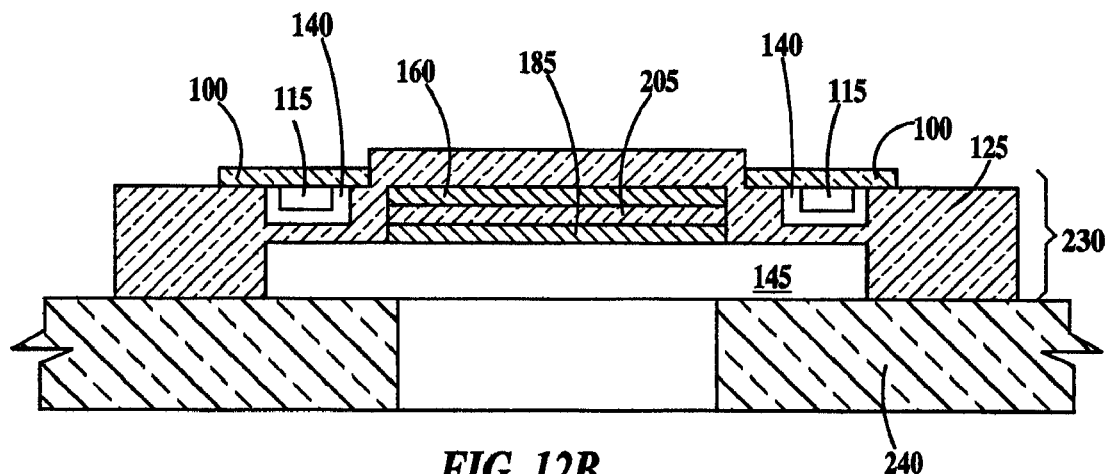

FIGS. 12A and 12B are cross-sectional views through line 12A/B—12A/B of FIG. 6A of the assembled space transformer 230 and probe card 240 of the according to two alternatives of first embodiment of the present invention.

FIGS. 12A and 12B specifically illustrate the positioning of decoupling capacitors 115 with the body of transformer die 125. In FIG. 12A, decoupling capacitors 115 are contained with cavity 145 of transformer die 125. In FIG. 12B, decoupling capacitors are contained in slot 140 within the body of transformer die 125. In both cases, decoupling capacitors 115 are within the body transformer die 125.

The space transformer of the second embodiment of present invention includes six elements that will be illustrated and described in turn after which the assembled space transformer will be described. Through holes for fasteners similar to those used in the space transformer for assembly, ground and power connection and assembly to the probe card of the first embodiment are present but have been eliminated for clarity. Thus fasteners and fasteners through holes will not be illustrated for any of the elements of the second embodiment of the present invention, but one of ordinary skill in the art would known where and how to employ fasteners and fastener through holes based on their usage in the first embodiment of the present invention described supra.

Figure 13A:
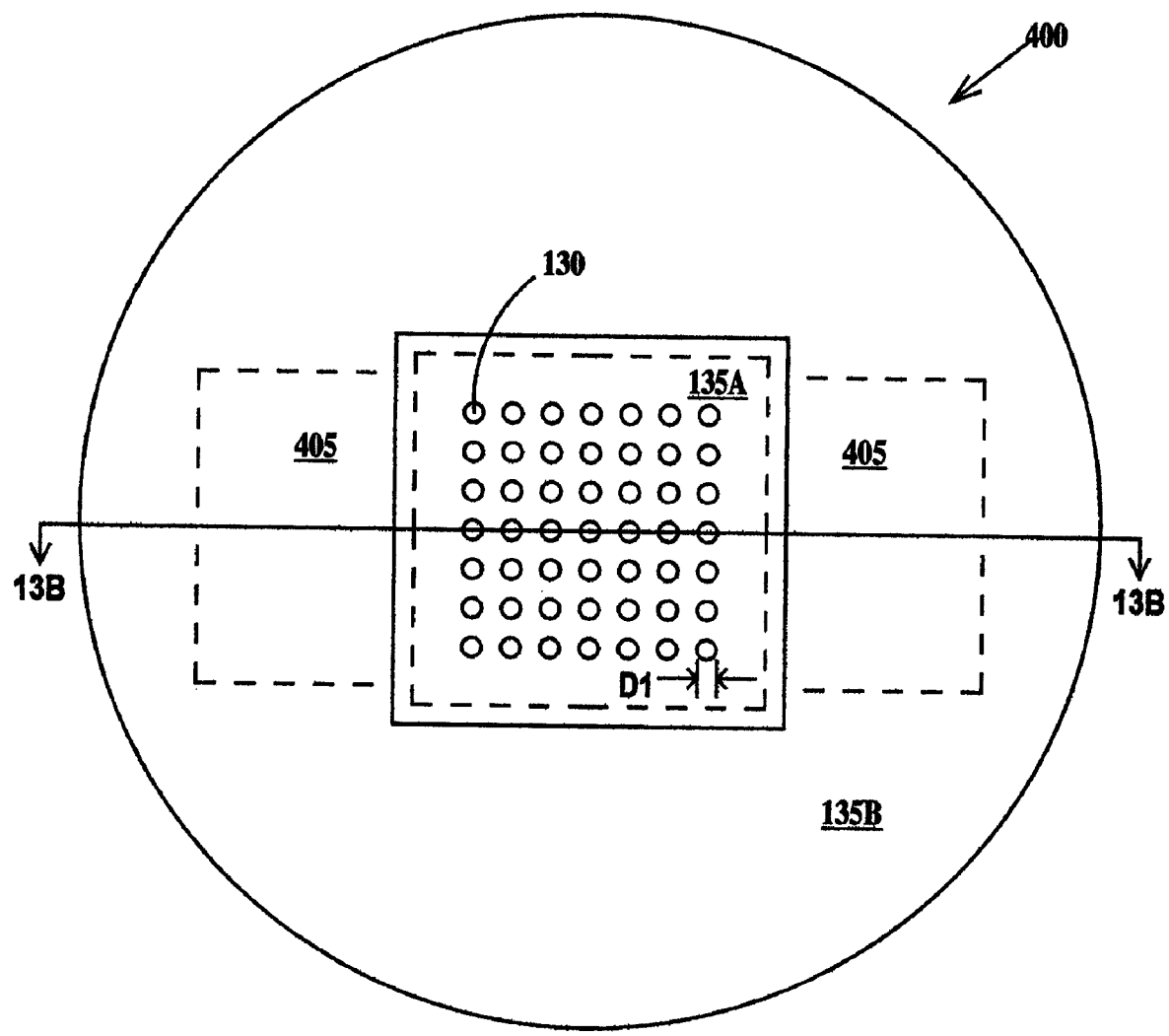
FIG. 13A is a top view and FIG. 13B is a cross-sectional view through line 13B—13B of FIG. 13A of a first element of a space transformer according to a second embodiment of the present invention.
Figure 13B:
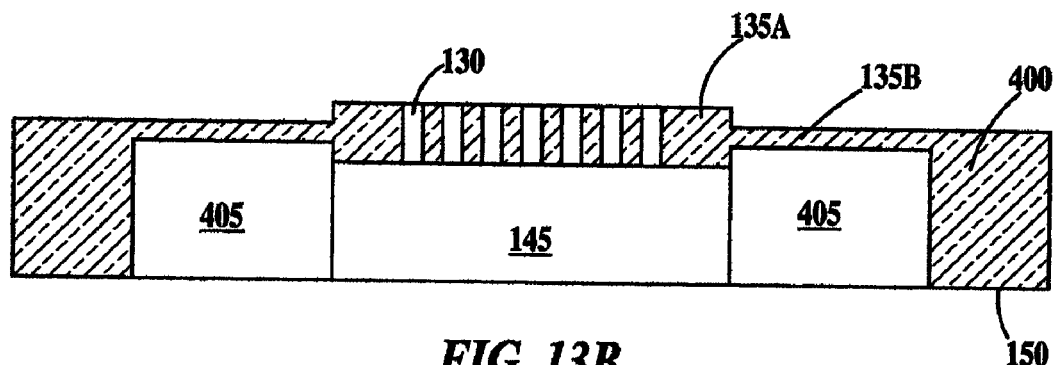

FIG. 13A is a top view and FIG. 13B is a cross-sectional view through line 13B—13B of FIG. 13A of a first element of a space transformer according to a second embodiment of the present invention. In FIGS. 13A and 13B, a transformer die 400 includes a multiplicity of through-holes 130 arranged in the same pattern and to the same pitch (chip contact to chip contact distance) as the chip contacts on an integrated circuit chip to be tested in central region 135A of the transformer die. Transformer die 400 comprises the body of the space transformer. In one example, through-holes 130 have a diameter D1 of about 0.0055 inches with un-insulated wires and pins are used and about 0.0065 when insulated wires and pins are used. Transformer die 400 is fabricated from a dielectric material. In one example transformer die 400 is fabricated from Vespel™ (a polyimide resin), manufactured by Dupont, Wilmington, Del.

Transformer die 400 includes cavity 145, which includes side chambers 405 under outer region 135 of the transformer die. Cavity 145 (and side chambers 405) are open to a bottom surface 150 of the transformer die.

Figure 14:
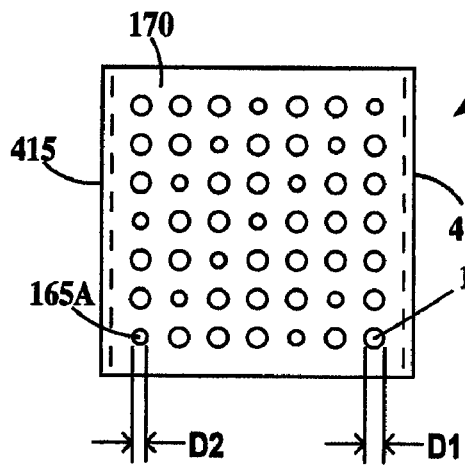
FIG. 14 is a top view a second element of the space transformer according to the second embodiment of the present invention.

FIG. 14 is a top view a second element of the space transformer according to the second embodiment of the present invention. In FIG. 14, a ground conductor 410 includes a multiplicity of through-holes 165A and 165B arranged in the same pattern and to the same pitch as through-holes 130 of FIG. 13A. Ground conductor 410 includes an inner region 170 (which includes through-holes 165A and 165B) and edge regions 415 (which may be plated and/or tinned) for electrical connection of decoupling capacitors 115 (see FIGS. 21A and 21B). In one example, through-holes 165A have a diameter D1 of about 0.0055 to 0.0065 inches and allow insulated/un-insulated pins/wires to pass through without electrical contact and through holes 165B have a diameter D2 of about 0.0055 to engage ground pins (see FIG. 21B) having an upper portion with a diameter of about 0.005 inches and a lower portion with a diameter of about 0.006 inches, which lower portion physically and electrically engages through holes 165B. In one example, ground conductor 410 has a thickness of about 0.030 inches. Ground conductor 410 is fabricated from a conductive material. In one example, ground conductor 410 is fabricated from a metal such as copper or aluminum. Ground conductor 410 is (conventionally) electrically connected to a ground terminal of a power supply.

Figure 15:
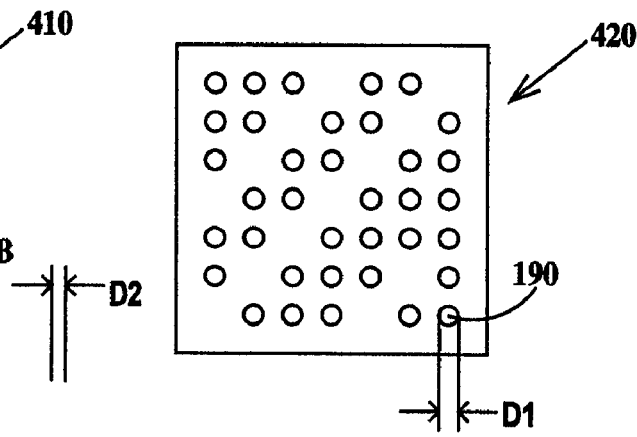
FIG. 15 is a top view of a third element of the space transformer according to the second embodiment of the present invention.

FIG. 15 is a top view of a third element of the space transformer according to the second embodiment of the present invention. In FIG. 15, an insulator 420 includes a multiplicity of through-holes 190 arranged in the same pattern and to the same pitch as through-holes 130 of FIG. 13A except there is no through-hole 190 in any position corresponding to a chip contact of the integrated circuit chip that carries ground. In one example, through-holes 190 have a diameter D1 of about 0.0055 to 0.0065 inches and insulator 420 has a thickness of about 0.015 inches. Insulator 420 is fabricated from a dielectric material. In one example, insulator 420 is fabricated from Vespel™.

Figure 16:
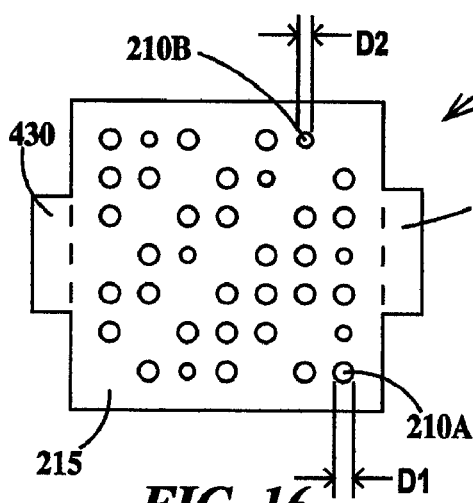
FIG. 16 is a top view of a fourth element of the space transformer according to the second embodiment of the present invention.

FIG. 16 is a top view of a fourth element of the space transformer according to the second embodiment of the present invention. In FIG. 16 a power conductor 425 includes a multiplicity of through-holes 210A and 210B arranged in the same pattern and to the same pitch as through-holes 130 of FIG. 13A except there is no through-hole 210A or 210B in any position corresponding to a chip contact of the integrated circuit chip that carries ground. Primary power conductor 425 includes an inner region 215 (which includes through-holes 210A and 210B) and tabs 430 (which may be plated and/or tinned) for physical and electrical connection of decoupling capacitors 115 (see FIGS. 21A and 21B). In one example, through-holes 210A have a diameter D1 of about 0.0055 to 0.0065 inches and allow insulated/un-insulated pins/wires to pass through without electrical contact and through holes 210B have a diameter D2 of about 0.0055 to engage ground pins (see FIG. 21B) having an upper portion with a diameter of about 0.005 inches and a lower portion with a diameter of about 0.006 inches, which lower portion physically and electrically engages through holes 210B. In one example, primary power conductor 420 has a thickness of about 0.030 inches. Primary power conductor 420 is fabricated from a conductive material. In one example, primary power conductor 420 is fabricated from a metal such as copper or aluminum. Primary power conductor 420 is (conventionally) electrically connected to a power terminal of a power supply.

Figure 17:
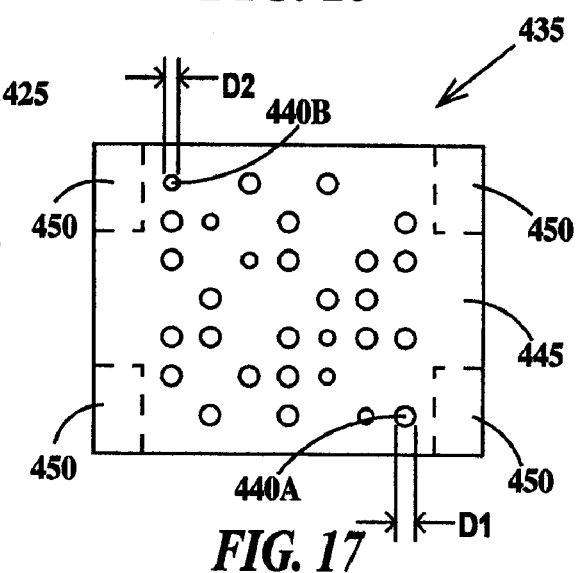
FIG. 17 is a top view of a fifth element of the space transformer according to the second embodiment of the present invention.

FIG. 17 is a top view of a fifth element of the space transformer according to the second embodiment of the present invention. In FIG. 17 a auxiliary power/ground board 435 includes a multiplicity of through-holes 440A and 440B arranged in the same pattern and to the same pitch as through-holes 130 of FIG. 13A except there is no through-hole 440A or 440B in any position corresponding to a chip contact of the integrated circuit chip that carries ground or primary power. Auxiliary power/ground board 435 includes an inner region 445 (which includes through-holes 440A and 440B) and contact regions 450 (which may be plated and/or tinned) for physical and electrical connection of decoupling capacitors 115 (see FIGS. 21A and 21B). In one example, through-holes 440A have a diameter D1 of about 0.0055 to 0.0065 inches and allow insulated/un-insulated pins/wires to pass through without electrical contact and through holes 440B have a diameter D2 of about 0.0055 to engage ground pins (see FIG. 21B) having an upper portion with a diameter of about 0.005 inches and a lower portion with a diameter of about 0.006 inches, which lower portion physically and electrically engages through holes 440B. In one example, auxiliary power board 435 has a thickness of about 0.030 inches. Auxiliary power/ground board 435 is fabricated from a dielectric material containing multiple wiring levels and through holes and plated through holes (i.e. a printed circuit board). Auxiliary power/ground board 435 is (conventionally) electrically connected to power terminals of one or more auxiliary power supplies. Because auxiliary power/ground board 435 contains multiple wiring levels, an unlimited number of auxiliary power supplies may be connected.

Figure 18:
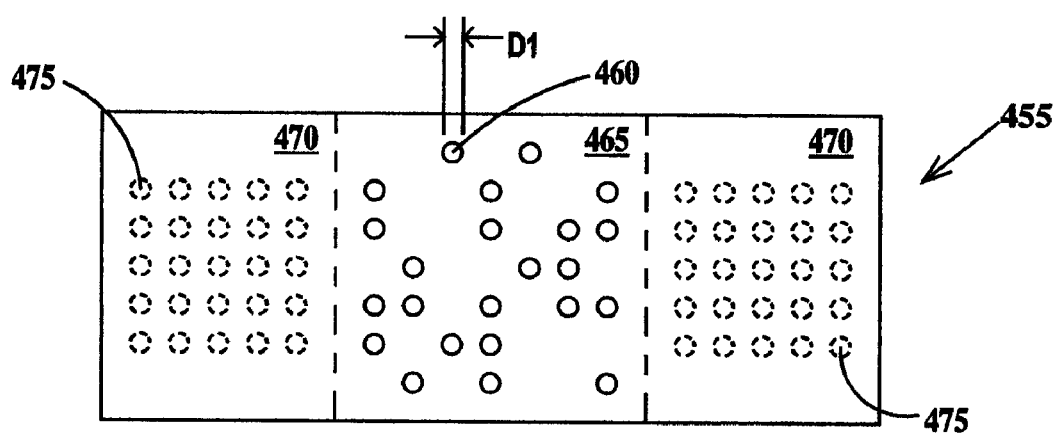
FIG. 18 is a top view of a sixth element of the space transformer according to the second embodiment of the present invention.

FIG. 18 is a top view of a sixth element of the space transformer according to the second embodiment of the present invention. In FIG. 17 a signal board 455 includes a multiplicity of plated through-holes 460 arranged in the same pattern and to the same pitch as through-holes 130 of FIG. 13A except there is no plated through-hole 460 in any position corresponding to a chip contact of the integrated circuit chip that carries ground, primary power or auxiliary power or ground. Signal board 455 includes an inner region 465 (which includes through-holes 460) and contact regions 470 having pads 475 for solder or solderless interconnects on an underside of signal board 455. Contact regions 470 are electrically connected to plated through holes 460 by wires (not shown) in one or more wiring layers in signal board 455. In one example, through-holes 460 have a diameter D1 of about 0.0055 to 0.0065 inches and allow insulated/un-insulated pins/wires to pass through and which are soldered in place in the through holes. In one example, signal board 455 has a thickness of about 0.030 inches. Signal board 455 is fabricated from a dielectric material containing multiple wiring levels and through holes and plated through holes (i.e. a printed circuit board).

Figure 19A:
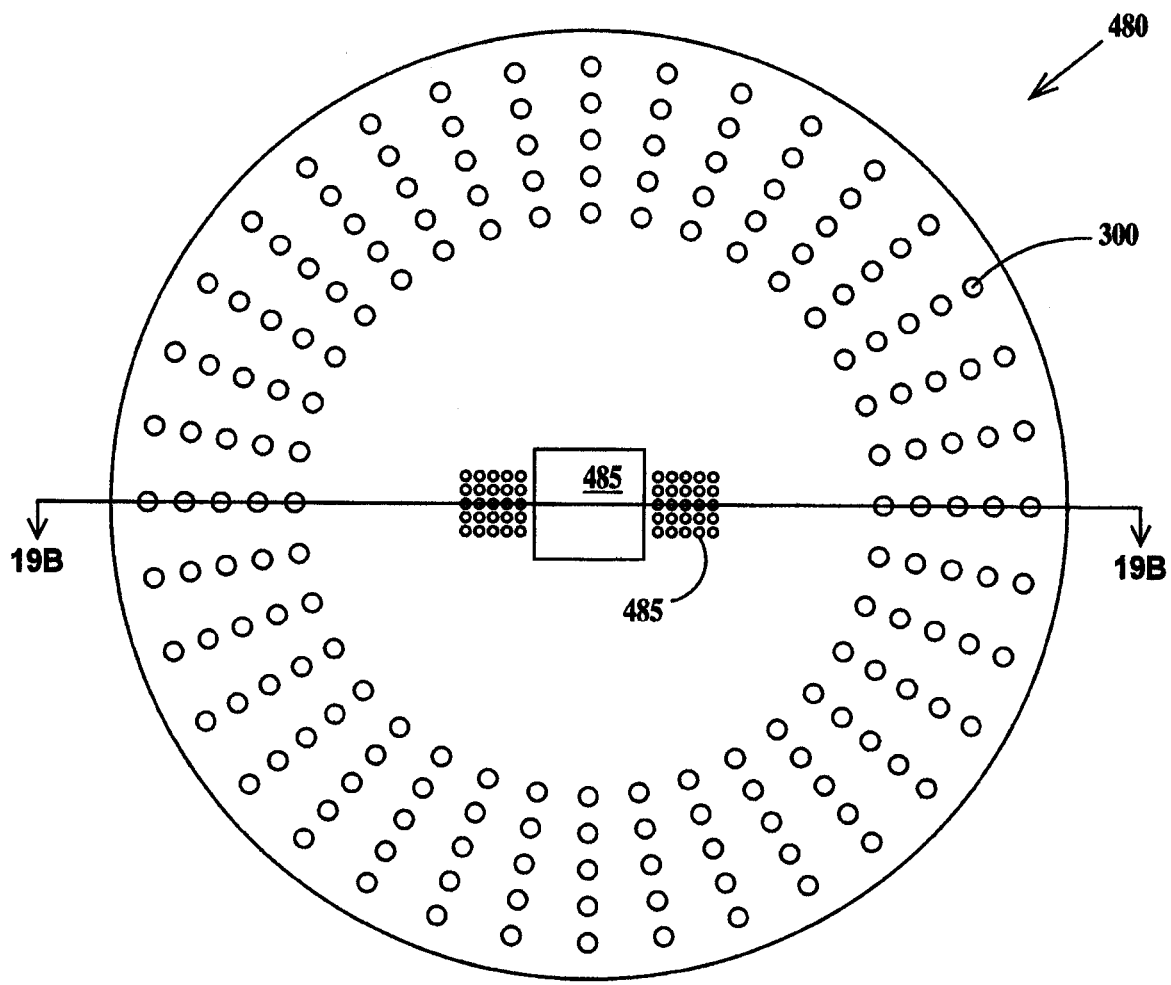
FIG. 19A is a top view and FIG. 19B is a cross-sectional view through line 19B—19B of FIG. 19A of a probe card for use with the second embodiment of the present invention.
Figure 19B:
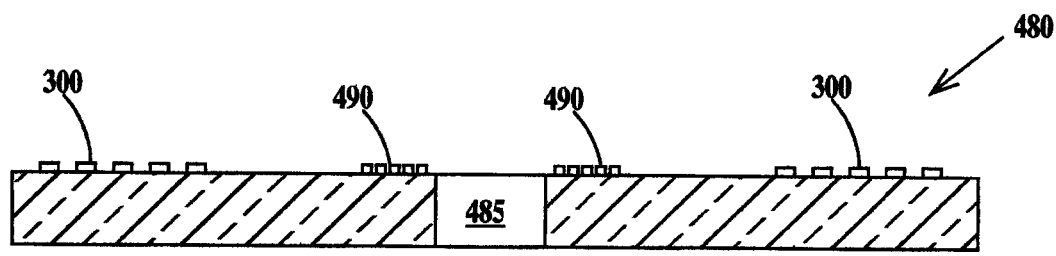

FIG. 19A is a top view and FIG. 19B is a cross-sectional view through line 19B—19B of FIG. 19A of a probe card for use with the second embodiment of the present invention. In FIGS. 19A and 19B, a probe card 480 includes a series of plated through holes 300 electrically connected to contacts 490 by wires (not shown) in the probe card. Similarly, certain plated through holes 300 are electrically connected by wires (not shown) in the probe card to assembly screws (not shown) in order to provide ground and power connections. Probe card 480 is provided with an opening 485 for insertion of signal pins (not shown, see FIG.21B) into signal board 455 (not shown, see FIG. 21B). Probe card 480 is fabricated from a dielectric material containing multiple wiring levels and through holes and plated through holes (i.e. a printed circuit board).

Figure 20:
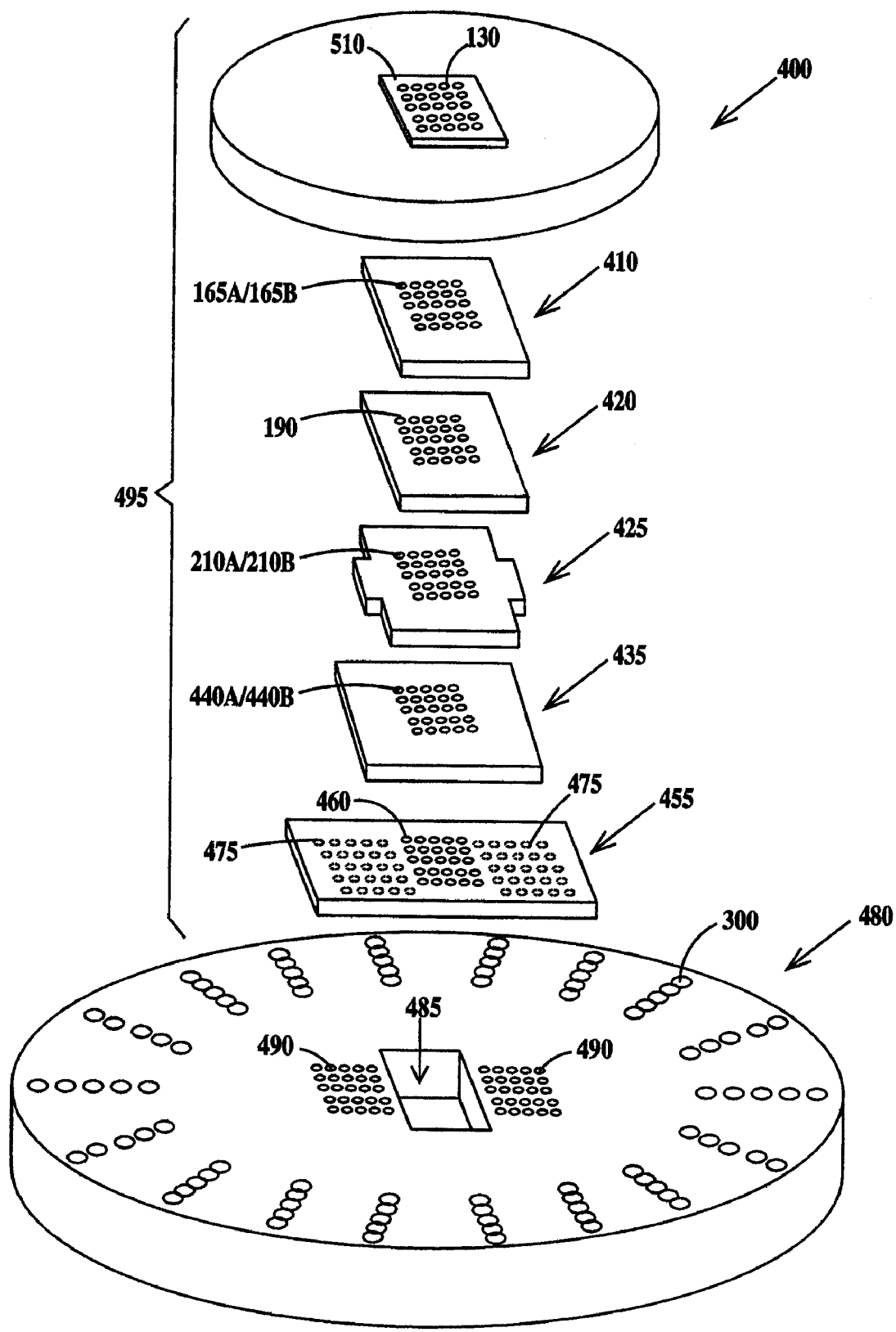
FIG. 20 is an exploded assembly view of the space transformers and probe card of the second embodiment of the present invention.

FIG. 20 is an exploded assembly view of a space transformer 495 and probe card 480 of the second embodiment of the present invention. In FIG. 20, space transformer 495 is assembled and mounted to probe card 480 as follows: (1) ground conductor 410 is placed in cavity 145 (see FIG. 13B) of transformer die 400; (2) ground pins 250 (see FIG. 21B) are press fitted into through holes 165B in ground conductor 410; (3) insulator 420 is placed in cavity 145 (see FIG. 13B); (4) primary power conductor 425 is placed in cavity 145 (see FIG. 13B); (5) power pins 255 (see FIG. 21B) are press fitted into through holes 210B; (6) auxiliary power/ground board 435 is placed in cavity 145 (see FIG. 13B) of transformer die 400; (7) auxiliary power/ground pins 505 (see FIG. 21B) are press fitted into through holes 440B; (7) transformer die 230 is fastened to probe card 240 by screws or other fasteners (not shown); (8) signal pins 515 (see FIG. 21B) are pressed fit into plated through holes 460, passing through opening 485 in probe card 480, auxiliary power board 435, power conductor 425, insulator 420, ground conductor 410 and transformer die 400; (9) cavity 145 (see FIG. 21B) is filled with a dielectric material and (10) the tips of ground pins, power pins and signal pins protruding from transformer die 400 are polished co-planer with topmost surface 510 of the transformer die. It should be noted that signal board 455 is positioned so plated through holes 460 align with opening 485 and pads 475 align with contacts 490.

Figure 21A:
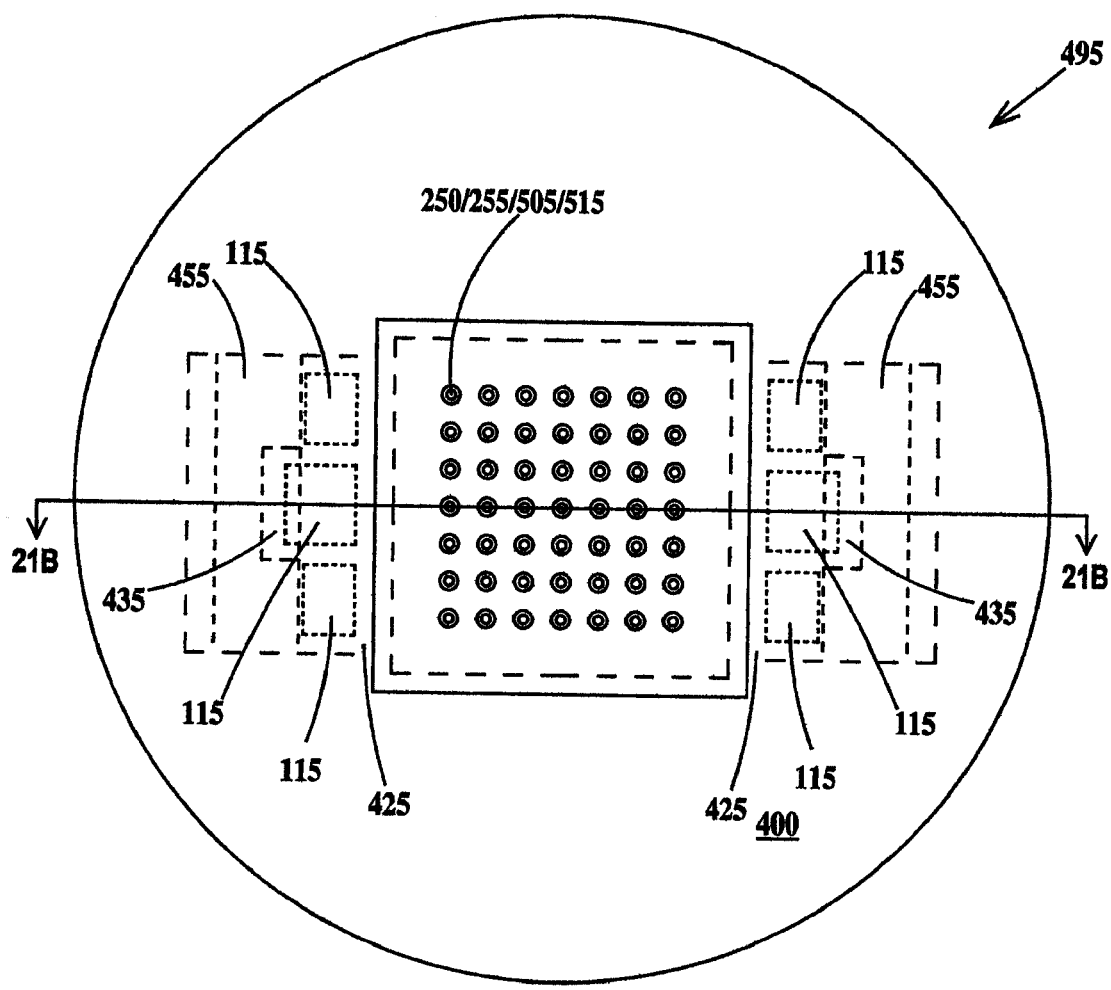
FIG. 21A is a top view and FIG. 21B is a cross-sectional view through line 21B—21B of FIG. 21A of the assembled space transformer mounted on the probe card according to the second embodiment of the present invention.
Figure 21B:
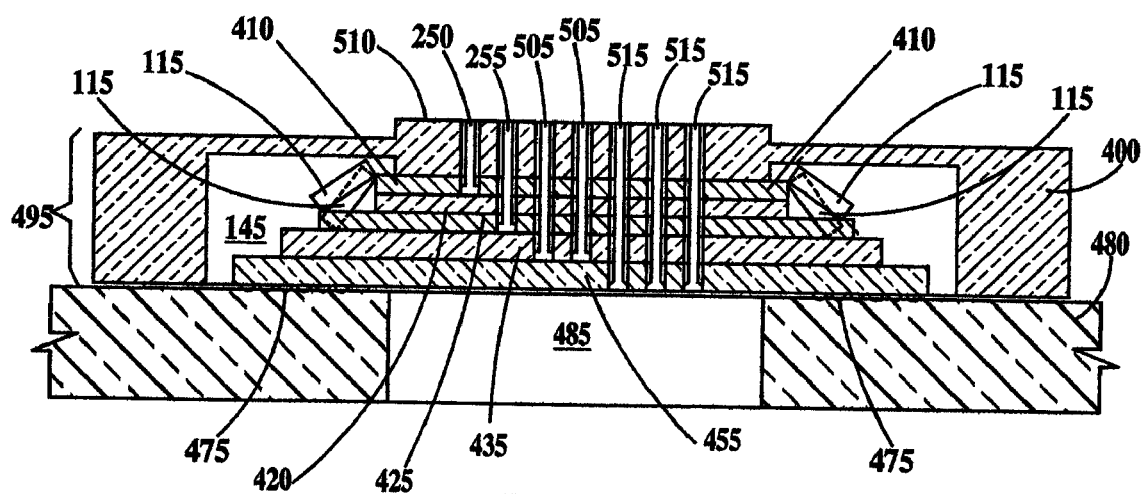

FIG. 21A is a top view and FIG. 21B is a cross-sectional view through line 21B—21B of FIG. 21A of assembled space transformer 495 mounted on probe card 480 according to the second embodiment of the present invention. In FIGS. 21A and 21B, electrically conductive ground pins 250 are press fitted into ground conductor 410, electrically conductive power pins 255 are press fitted into primary power conductor 420 and auxiliary power/ground pins 505 are press fitted into auxiliary power/ground board 435. Signal pins 515 are press fitted into signal board 455. Cavity 145 is filled with a dielectric material (not shown for clarity).

A first portion of decoupling capacitors 115 are physically and electrically connected between ground conductor 410 and primary power conductor 435. A second portion of decoupling capacitors 115 are physically and electrically connected between ground conductor 410 and auxiliary power/ground board 435. Note all decoupling capacitors are located below a top surface 510 of transformer die 400 and in cavity 145 thus reducing to a minimum the capacitor interconnect inductance and resistance parasitics. The length of the electrical path between decoupling capacitors 115 and tips of ground pins 250, power pins 255 and auxiliary power/ground pins 505 at the surface of space transformer 495 is between about 5 to 25 millimeters. The length of the electrical path between the tips of ground pins 250, power pins 255 and auxiliary power/ground pins 505 at the top surface 510 of space transformer 495 and ground conductor 410, primary power conductor 420 and auxiliary power/ground power board 435 respectively is about 1 to 3 mm. Also, because of the thickness of ground conductor 410 and of primary power conductor 425, resistive parasitics are reduced and more current can be carried with reduced voltage drop. Because of the location of decoupling capacitors 115 within space transformer 495, more decoupling capacitance is available than with conventional space transformers.

Ground pins 250, power pins 255, auxiliary power/ground pins 505 and signal pins 515 are illustrated as un-insulated. Insulated pins and/or un-insulated pins or combinations of insulated and un-insulated pins may be used.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. The present invention was described with the outermost conductor being electrically connected to the ground terminal of the power supply for safety and t comply with equipment design conventions. Therefore, it is intended that the following claims cover all such modifications and changes as fall within the true spirit and scope of the invention.

What is claimed is:

1. A space transformer comprising:
    an insulating body having a top surface and an opposite bottom surface and a cavity open to said bottom surface;
    though holes extending from said top surface of said body to said cavity;
    a discrete ground conductor having a top surface and an opposite lower surface, said ground conductor contained within said cavity, said top surface of said ground conductor in direct physical contact with an inner surface of said cavity opposite said top surface of said body;
    a discrete insulator having a top surface and an opposite bottom surface, said insulating layer contained within said cavity, said top surface of said insulating layer in direct physical contact with said bottom surface of said around conductor;
    a discrete power conductor having a top surface and an opposite lower surface, said power conductor contained within said cavity, said top surface of said power conductor in direct physical contact with said lower surface of a insulator;
    a first printed circuit board having a top surface and an opposite bottom surface, said first printed circuit board contained within said cavity, said first printed circuit board comprising at least one electrically conductive wiring layer and one dielectric layer, said top surface of said first printed circuit board in direct physical contact with said bottom surface of said power conductor;
    a second printed circuit board having a top surface and an opposite bottom surface, said second printed circuit board contained within said cavity, said second printed circuit board comprising at least one electrically conductive wiring layer and one dielectric layer, said top surface of said second printed circuit board in direct physical contact with said bottom surface of said first printed circuit board;
    one or more discrete first decoupling capacitors physically located within said cavity and electrically connected between said ground conductor and said power conductor; and
    one or more discrete second decoupling capacitors physically located within said cavity and electrically connected between said ground conductor and at least one of said at least one electrically conductive wiring layer of said first printed circuit board.

2. The space transformer of claim 1, further including:
    one or more ground pins electrically connected to and extending from said ground conductor through said a first set of said through holes in said body to said top surface of said body;
    one or more power pins electrically connected to and extending from said power conductor though a second set of said through holes in said body to said top surface of said body;
    one or signal pins extending through a third set of said through holes in said body to said top surface of said body; and
    one or more auxiliary power/ground pins electrically connected to and extending from said auxiliary power/ground board through a fourth set of said through holes in said body to said top surface of said body.

3. The space transformer of claim 2, wherein the length of an electrical path between said decoupling capacitors and said one or more ground pins and said one or more power pins at said top surface of said body is between 5 to 25 millimeters.

4. The space transformer of claim 2, wherein the length of an electrical path between tips of said one or more ground pins and said one or more power pins at said top surface of said body and said ground conductor and said power conductor respectively is between 1 to 3 millimeters.

5. The space transformer of claim 1, wherein each of said one or more discrete first decoupling capacitors and each of said one or more discrete second decoupling capacitors have an inductance between 175 pico Henries and 1 nano Henry.

6. The space transformer of claim 1, wherein each of said one or more discrete firs decoupling capacitors and each of said one or more discrete second decoupling capacitors have an inductance less than 60 pico Henries.

7. The space transformer of claim 1, wherein perimeters of said ground conductor and said insulator and are aligned entirely within a perimeter of said power conductor and said perimeter of said power conductor is aligned entirely within a perimeter of said first printed circuit board.

8. The space transformer of claim 1, wherein first contacts of said one or more discrete first decoupling capacitors are physically connected to said ground conductor and second contacts of said one or more discrete first decoupling capacitors are electrically connected to at least one of said at least one electrically conductive wiring layer of said first printed circuit board.

9. The space transformer of claim 1, wherein first contacts of said one or more discrete second decoupling capacitors are physically connected to said ground conductor and second contacts of said one or more discrete first decoupling capacitors are electrically connected to at least one of said at least one electrically conductive wiring layer of said second printed circuit board.

* * * * *